United States Patent [19]

Grimes

[11] Patent Number: 4,516,250
[45] Date of Patent: May 7, 1985

[54] FREQUENCY AND PHASE COMPARATOR WITH SLIP DETECTION CAPABILITY

[75] Inventor: Gary J. Grimes, Thornton, Colo.

[73] Assignee: AT&T Information Systems, Holmdel, N.J.

[21] Appl. No.: 526,642

[22] Filed: Aug. 26, 1983

[51] Int. Cl.³ ............................................. H03D 3/18
[52] U.S. Cl. ................................... 375/82; 328/134; 329/104; 329/110
[58] Field of Search ...................... 375/79, 80, 82, 96, 375/118, 119; 455/214; 329/104, 110, 128, 137; 328/109, 110, 133, 134, 141; 307/514, 516, 526, 528; 324/79 R, 79 D, 82, 83 R, 83 FE, 83 D; 331/1 A, 25

[56] References Cited

U.S. PATENT DOCUMENTS

| | | | |
|---|---|---|---|
| 3,543,177 | 11/1970 | Chang | 307/526 |
| 3,663,884 | 5/1976 | Pattantyus | 328/134 |
| 3,766,484 | 10/1973 | Morris et al. | 375/118 |
| 3,947,775 | 3/1976 | Thiebaut | 328/134 |
| 4,012,598 | 3/1977 | Wiley | 375/118 |
| 4,264,866 | 4/1981 | Benes | 328/134 |
| 4,378,509 | 3/1983 | Hatchett et al. | 307/526 |

OTHER PUBLICATIONS

"A Cycle Slip Detector for Phase Locked Demodulators", *IEEE Transactions on Instrumentation and Measurement*, F. M. Gardner, vol. IM-26, No. 3, Sep. 1977, pp. 251-254.

*Primary Examiner*—Benedict V. Safourek
*Attorney, Agent, or Firm*—D. M. Duft

[57] ABSTRACT

A frequency and phase comparator circuit for determining the frequency difference between a reference signal of a known frequency and a variable signal of unknown frequency. The subject circuit monitors the two signals and detects the occurrence of phase shifts between the two signals. In particular, this circuit detects phase shifts of 180 degrees and 360 degrees and records a full slip indication with each occurrence of a 360 degree phase shift. These phase shifts indicate that at some point in time during transmission, the two signals were out of phase and not of exact frequency. In addition, the subject circuit provides a direction of drift indication with each 180 degree shift. These direction indications are output following a 360 degree phase shift or full slip and are determinative of the relative frequencies of the two signals by designating whether the frequency of the variable signal is higher or lower than that of the reference signal over the duration of the full slip. Appropriate adjustments may then be rendered to adjust the frequencies.

24 Claims, 7 Drawing Figures

HALF SLIP

FREQUENCY AND PHASE COMPARATOR WITH SLIP DETECTION CAPABILITY

FIELD OF THE INVENTION

This invention relates to frequency and phase comparators and, more particularly, to frequency and phase comparators having improved capability to produce slip rate and difference frequency indications.

BACKGROUND OF THE INVENTION

In digital systems, it is often necessary to determine the relationship between two frequencies in order to provide control information for system frequency adjustments. This relationship is determined by transmitting two signals, a reference signal of a known frequency and a variable signal of an unknown frequency, to a frequency and phase comparator. The frequency and phase comparator monitors these signals and provides frequency difference information.

One type of frequency difference information is the detection of slips between the two signals. A slip indicates that during transmission the two signals are not always of equal frequency, but at times the variable signal changes frequency with respect to the reference signal. Assume that the two signals are squarewaves having transitional points corresponding to the leading and trailing edges of the squarewave pattern associated with each signal, and that these edges are consistently identifiable for each signal throughout transmission. Assume further that the leading edge is the preselected transition point for both signals which the frequency and phase comparator monitors. Therefore, when the leading edges of both signals coincide, the two signals are in phase and of equal frequencies. It is the function of the frequency and phase comparator to detect this coincidence between the leading edges of each signal.

The frequency and phase comparator detects slips when there is a lack of coincidence between the leading edges of each signal. In particular, when the variable signal changes frequency with respect to the reference signal such that the two signals are close in frequency but not equal, the leading edges of the variable signal drift with respect to the leading edges of the reference signal. The two signals are now also out of phase with respect to one another. The two signals remain out of phase until the leading edges of the variable signal drift back to the point where all the leading edges of both signals coincide. This indicates that both signals are of equal frequency and in phase again.

The above-described situation where the two signals are out of phase with respect to each other for some duration of time is identified as a slip. A full slip occurs when the leading edges of the variable signal drift 360 degrees before all the leading edges of both signals again coincide. A full slip identifies a time during transmission when the frequency of the variable signal did not equal the frequency of the reference signal. The frequency and phase comparator records the number of full slips and produces a slip rate indication. The slip rate represents the number of times the variable signal changes frequency with respect to the reference signal during transmission.

Another type of adjustment information is a difference frequency indication. The difference frequency specifies the direction of drift of the variable signal as well as the magnitude of the frequency change. The direction of drift identifies whether the frequency of the variable signal is higher or lower than the frequency of the reference signal over the duration of each slip.

In determining a slip rate or a difference frequency indication, it is not necessary to use only squarewaves. Both signals may be represented as any arbitrary waveform, such as triangular, sawtooth or rectangular. The only requirement is that the waveforms have a consistent identifiable transition point which can be monitored by a frequency and phase comparator during transmission.

There are several problems associated with the currently available comparators. For example, the comparator disclosed in U.S. Pat. No. 3,663,884 issued to Pattantyus on May 16, 1972 produces a difference frequency indication only when the variable signal is higher in frequency than the reference signal. The obvious disadvantage of this comparator is that there is no difference frequency output when the frequency of the variable signal is lower than the frequency of the reference signal.

Another example is found in U.S. Pat. No. 4,264,866 issued to Benes on Apr. 28, 1981. The Benes frequency and phase comparator produces a difference frequency indication that is distorted by any noise or "jitter" which occurs in the variable signal as a result of unsustained abrupt changes in the monitored transition point of the phase. When the monitored transition point of the variable signal drifts more than 90 degrees with respect to the monitored transition point of the reference signal, the Benes comparator misinterprets the relationship of the transitional points between the two signals and produces an output that indicates a full slip even though a true full slip did not occur.

One further example is found in an article entitled, "A Cycle-Slip Detector for Phase-Locked Demodulators" by Floyd M. Gardner, which appeared in the IEEE Transactions on Instrumentation and Measurement, Vol. IM-26, No. 3, September 1977. The Gardner comparator fails to detect slips until the monitored transition point of the variable signal drifts 270 degrees with respect to the monitored transition point of the reference signal. Therefore, a first full 360 degree slip is not detected until an initial drift of 270 degrees. Slip detection is inefficient since time is wasted before a first slip is detected and a frequency change in the variable signal may result during this initial drift.

SUMMARY OF THE INVENTION

The subject invention provides a frequency and phase comparator circuit having improved slip detection capabilities. This comparator provides both a difference frequency indication and a slip rate indication between a reference signal $F_R$ of a known frequency and a variable signal F of an unknown frequency.

A first embodiment of this comparator provides only a slip rate indication. For explanation purposes, assume the signals are squarewaves wherein the monitored preselected transition point is the leading edge of each squarewave. Reference signal $F_R$ is received by a window generator. The window generator changes state in response to each leading edge of the reference signal $F_R$ and generates a window signal for a specified duration at a fixed rate as determined by the frequency of the reference signal $F_R$.

Variable signal F is indirectly received by a trigger generator. The trigger generator changes state in response to each leading edge of the variable signal F and generates a trigger pulse at this edge.

A coincidence detector detects the coincidence of the trigger pulse with the window signal. This coincidence indicates that the leading edge of the reference signal $F_R$ coincides with the leading edge of the variable signal F. Therefore, these two signals are in phase and are of equal frequencies at the time of coincidence.

In response to this coincidence, the coincidence detector applies a signal to a programmable inverter which controllably inverts the variable signal F 180 degrees with respect to its phase at the time of the coincidence. The inverted variable signal F is now 180 degrees out of phase with respect to the reference signal $F_R$. The trigger pulse still occurs at each leading edge of the squarewave associated with the inverted variable signal F and therefore the trigger pulse immediately following the inversion shifts 180 degrees with respect to its position at the time of the coincidence. This phase shift of the variable signal F and its corresponding trigger pulse provides a reference leading edge. The comparator monitors the reference leading edge to determine whether the variable signal F drifts with respect to the leading edge of the reference signal $F_R$ due to a change in frequency.

Assume that the frequencies of the reference signal $F_R$ and the variable signal F do not remain equal during transmission, but that the frequency of the variable signal F changes slightly so that the frequencies of the two signals are close. This change of frequency causes the reference leading edge of the variable signal F to drift with respect to its position after the initial 180 degree phase shift. Note that the reference leading edge of the variable signal F is 180 degrees out of phase with respect to the leading edge of the reference signal $F_R$. The reference leading edge can, therefore, only drift 180 degrees before the coincidence detector detects the next coincidence of the trigger pulse and the window signal which indicates that the leading edges of the two signals coincide.

Assume that another coincidence of the window signal and a trigger pulse occurs. These two consecutive coincidences with drift in the interim represent a half slip. After the first half slip is detected, the coincidence detector applies a signal indicative of this half slip to a slip counter. However, the slip counter does not increment in response to this second coincidence, but is primed to respond to the next coincidence. Additionally, in response to this second coincidence, the programmable inverter establishes a new reference leading edge which is monitored over a second 180 degrees of the phase.

The coincidence detector then detects the third coincidence of the window signal and the trigger pulse. This represents the second half slip. Two half slips represent a full slip or a 360 degree phase shift between the variable signal F and the reference signal $F_R$. The coincidence detector applies a signal indicative of this second half slip to the primed slip counter. In response to this signal, the slip counter increments and generates an output signal which indicates the occurrence of a full slip. This full slip indicates that the variable signal F changed frequency with respect to the reference signal $F_R$ at some point during transmission.

The detection of half slips by the subject frequency and phase comparator circuit establishes more precise parameters for detecting frequency differences than currently available to the art. For example following system initialization, slip detection for a full slip begins after a first phase shift of 180 degrees. This is an improvement over the Gardner comparator which does not begin slip detection until an initial phase shift of 270 degrees.

Another advantage is that the detection of false phase shifts or slips due to jitter are eliminated. Since a new reference leading edge is provided following each coincidence, the coincidence detector responds only to leading edge coincidences that occur following a phase shift of 180 degrees. The currently available Benes comparator only rejects jitter within 90 degree parameters and therefore, responds to transition points occurring outside 90 degrees. This inflates the slip rate and provides false indications of frequency differences.

A second embodiment of the subject comparator generates a difference frequency indication in addition to a slip rate indication. This embodiment overcomes the limitation associated with the Pattantyus comparator and provides a difference frequency indication output under conditions when the variable signal F is both higher and lower in frequency than the reference signal $F_R$.

The embodiment of this comparator includes the additional elements of a pre- and post window generator and a direction and type indicator. These additional elements are operational only after the occurrence of the first, second and third coincidences. These three coincidences, as previously mentioned, represent a full slip. The first coincidence indicates the start of the full slip, the second coincidence indicates the end of the first half of the full slip, and the start of the second half of the full slip, and the third coincidence indicates the end of the full slip. This comparator detects coincidences in the same manner previously described in connection with the embodiment of the first comparator and therefore, the process of slip detection is not discussed in connection with this second embodiment.

After the first coincidence of the window signal and the trigger pulse, and assuming the variable signal F and the reference signal $F_R$ are close in frequency but not equal, the reference leading edge of the variable signal F drifts. A trigger generator produces a trigger pulse at the reference leading edge of the variable signal F. The additional elements of the prewindow and post window generator generate prewindow and post window signals in response to the same conditions previously described in connection with the window generator of the first embodiment. The reference leading edge with its corresponding trigger pulse may, therefore, also coincide with a prewindow or post window signal. This type of coincidence locates the direction of the drift by determining whether the reference leading edge approaches the window signal through the prewindow side or the post window side after the first coincidence. For example, prewindow coincidence indicates a higher frequency and a post window coincidence indicates a lower frequency.

This coincidence of either the prewindow or post window signal and the reference leading edge with its corresponding trigger pulse is extended to the direction and type indicator. The direction and type indicator stores this information with the occurrence of the second coincidence. This stored information indicates whether the frequency of the variable signal is higher or lower than the frequency of the reference signal for the first half slip.

The second coincidence also enables the direction and type indicator to receive an additional signal. This additional signal indicates the next coincidence of either the prewindow or post window signal and the reference leading edge with its corresponding trigger pulse. This additional signal represents the direction of drift of the new reference leading edge of the variable signal F with respect to the leading edge of the reference signal $F_R$ during the second half slip. The direction and type indicator receives this additional signal and stores this information the occurrence of the third coincidence. The direction and type indicator generates a direction and a type signal in response to the third coincidence.

The direction signal indicates the direction, either prewindow or post window, of the last half of the full slip. The type signal indicates whether both halves of the slip are within the same (both prewindow, both post window) or opposite (prewindow then post window, or post window then prewindow) directions with respect to each other. The resulting direction and type signals indicate whether the variable signal is higher or lower in frequency than the reference signal during each half of the full slip. This information allows a determination of the net change in frequency (i.e., the difference frequency) for each full slip.

BRIEF DESCRIPTION OF THE DRAWINGS

This invention may be better understood by reading the following detailed description with reference to the accompanying drawings wherein.

DETAILED DESCRIPTION OF THE DRAWINGS

Figure 1:
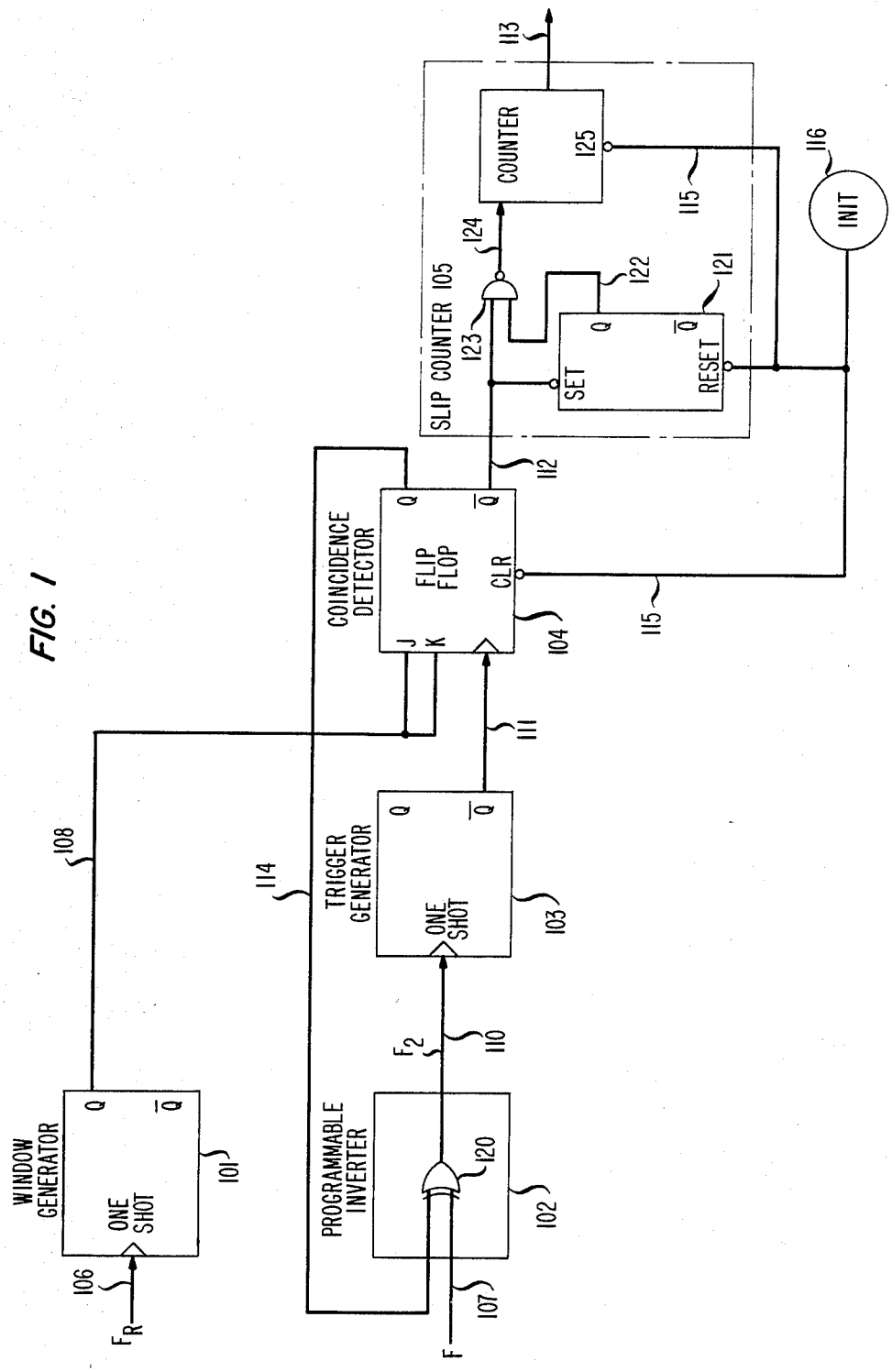
FIG. 1 discloses the details of a first embodiment of a frequency and phase comparator having slip detection capability.

FIG. 1 illustrates one embodiment of the subject frequency and phase comparator circuit having slip detection capability. For the purposes of explanation, the signals received by the frequency and phase comparator circuit are assumed to be a series of squarewaves having transition points at the leading and trailing edges of the waveform. Assume further that the leading edge of each squarewave is the monitored preselected transition point. The subject comparator monitors the leading edges of each signal to determine the occurrence of a slip between the two signals during transmission. For example, assume that the signals are initially of equal frequencies and in phase. Also assume a frequency change occurs in one signal with respect to the remaining signal such that the leading edges of one signal drift with respect to the leading edges of the remaining signal. This drift represents a slip. Drift of 180 degrees indicate a half slip. Drift of 360 degrees indicates a full slip or a complete return to equal frequencies and phase. This comparator detects both half slips and full slips, but does not reflect a slip count except with the occurrence of each full slip. A full slip represents a frequency difference that occurred between the two signals during transmission.

Slip Detector Circuit—Half Slip Indication

The circuit of FIG. 1 comprises window generator 101, programmable inverter 102, trigger generator 103, coincidence detector 104 and slip counter 105. The circuit is initialized by element 116 which applies a low signal over path 115 to all connected circuit logic. The low signal puts coincidence detector 104 and slip counter 105 in a known beginning state prior to detection of the first slip. This eliminates all previous indications of prior slips. Following initialization, element 116 applies a high signal over path 115 to all connected circuit logic and maintains this high signal output throughout slip detection operations.

Figure 2:
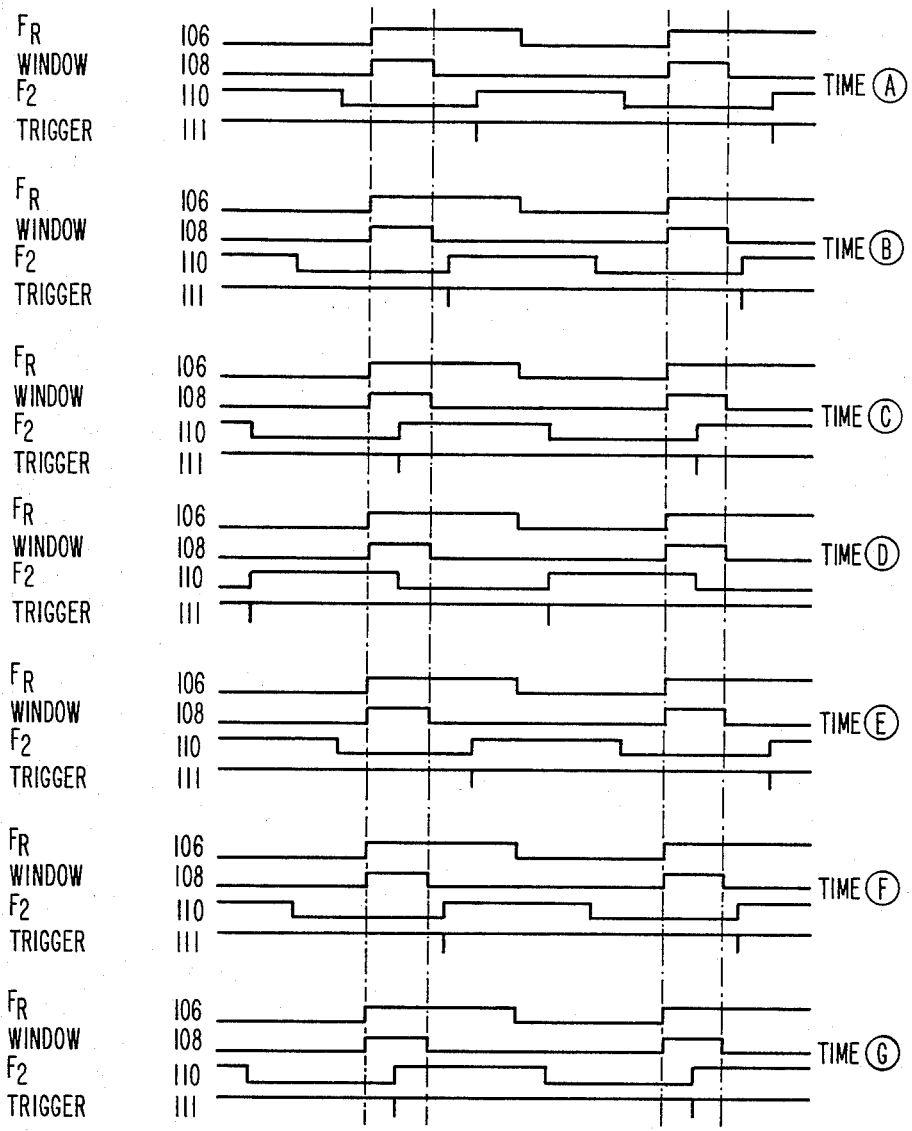
FIG. 2 illustrates a series of waveforms shown at separately identifiable times as related to the circuit of FIG. 1.

After initialization, the circuit of FIG. 1 receives two input signals over paths 106 and 107, respectively. The signal on path 106 is the reference signal $F_R$ having a known frequency. The reference signal $F_R$ is transmitted to window generator 101 which responds to each leading edge of the reference signal $F_R$ and generates a window signal of a specified duration for each such response. FIG. 2 illustrates the reference signal $F_R$ on lines 106 and the generated window signal which is of a predetermined unit of time as shown between the adjacent verticle dotted lines of FIG. 2 on lines 108.

The signal on path 107 is the variable signal F having an unknown frequency. The variable signal F is transmitted to programmable inverter 102 which can controllably invert or not invert the variable signal F. Programmable inverter 102 generates signal $F_2$. The function of programmable inverter 102 and its relation to signal $F_2$ is discussed subsequently. The variable signal F is not shown on FIG. 2 since its state may be altered by programmable inverter 102 and only signal $F_2$ activates further circuitry. Signal $F_2$ is shown on lines 110 of FIG. 2. Programmable inverter 102 applies signal $F_2$ over path 110 to trigger generator 103.

Trigger generator 103 responds to each leading edge of signal $F_2$ and generates a trigger pulse for each such response. FIG. 2 illustrates the trigger pulse on lines 111.

For the remainder of this description, the comparator of FIG. 1 responds to and monitors all leading edges of the reference signal $F_R$ and the signal $F_2$. The relationship between the reference signal $F_R$ and the signal $F_2$ provide the information necessary to produce a frequency difference indication with respect to the reference signal $F_R$ and the variable signal F. This frequency difference results when the variable signal F changes frequency with respect to the reference signal $F_R$. This frequency change in the variable signal F is reflected by the state of the signal $F_2$. Therefore, the comparator operates to detect slips between the signal $F_2$ and the reference signal $F_R$ during transmission.

Coincidence detector 104 receives window signals over path 108 from window generator 101 and trigger pulses over path 111 from trigger generator 103. Coincidence detector 104 responds to each coincidence of the window signal and the trigger pulse. A detected coincidence indicates that the leading edge of signal $F_2$ occurs during the window signal generated by the leading edges of the reference signal $F_R$. This coincidence further indicates that the reference signal $F_R$ and the variable signal F are of equal frequencies and in phase if this is the start of a full slip. Assume for the remainder of this description that the coincidence of the window signal on line 108 and the trigger pulse on line 111 at time C of FIG. 2 is the start of a full slip, unless otherwise indicated.

FIG. 2 illustrates the appearance of the abovementioned signals during seven separately identifiable times, A through G. Each identified time shows the relationship of all four signals. In particular, FIG. 2 illustrates the appearance of the signals over the duration of a half slip from times C through G.

Disregarding times A and B at this point, time C shows the first coincidence of the trigger pulse and the window signal. This indicates that the two signals, reference signal $F_R$ and signal $F_2$ are in phase and of equal frequencies. In response to this coincidence, the signal $F_2$ is immediately inverted 180 degrees so that the leading edge is now shifted 180 degrees with respect to its position at the time of the coincidence. This is shown at time D. This process and the reason for inverting the signal is discussed subsequently. The shifted leading edge is now the reference leading edge.

The reference leading edge is monitored over 180 degrees since the reference signal $F_R$ and the signal $F_2$ will be in phase again after the reference leading edge drifts only 180 degrees. Assuming that the two signals are not maintaining equal frequencies and that the signal $F_2$ is changing frequency, the reference leading edge drifts with respect to its shifted position. As illustrated at time E and F, the reference leading edge and its associated trigger pulse are drifting to the left because of the changing frequency of the signal $F_2$. At time G, another coincidence occurs between the window signal and the trigger pulse. This represents the conclusion of the first half slip. A half slip indicates that the variable signal F has changed frequency with respect to the reference signal $F_R$. The frequencies of these two signals are not again equal and in phase until the occurrence of one full slip. A full slip is discussed subsequently.

As previously mentioned, the coincidence detector 104 responds only to the coincidence of the trigger pulse and the window signal. Therefore during times A, B, D, E and F of FIG. 2, the coincidence detector is unresponsive. However, when there is a coincidence such as shown at time C of FIG. 2, coincidence detector 104 changes state and applies a signal indicative of this change of state over path 114 to programmable inverter 102 which then inverts the variable signal F. In particular, since time C is the first coincidence of the window signal and trigger pulse, coincidence detector 104 changes from a reset to a set state and drives its Q output high. Coincidence detector 104 applies a high signal over path 114 to exclusive OR gate 120. The variable signal F on path 107 is always a high at the time of a coincidence. The combination of the two high signals on paths 114 and 107, respectively, causes exclusive OR gate 120 to apply a low signal on path 110 to trigger generator 103. The low signal on path 110 is now the inverted signal $F_2$. The signal $F_2$ remains low until the next coincidence of the window signal and trigger pulse, at which time coincidence detector 104 switches to a reset state and applies a low signal over path 114 from its Q output to exclusive OR gate 120. Since the variable signal F is always a high signal at the time of the coincidence, the combination of a high signal on path 107 and a low signal on path 114 causes exclusive OR gate 120 to apply a high signal over path 110. Thereafter, in response to each coincidence, the signal $F_2$ alternates between low and high signals throughout the process of slip detection or until reinitialization. Therefore, the variable signal F is inverted in response to alternate coincidences.

Programmable inverter 102 inverts the incoming variable signal F and generates the signal $F_2$ in response to the signal generated by coincidence detector 104 as a result of the coincidence shown at time C of FIG. 2. The signal $F_2$ is now 180 degrees out of phase with respect to the reference signal $F_R$. This situation is illustrated at times C and D of FIG. 2. The leading edge of the signal $F_2$ is, as previously described, the reference leading edge. The reference leading edge is monitored over the duration of the half slip or until the next coincidence of the window signal and the trigger pulse, as shown at time G. This next coincidence occurs when the reference leading edge drifts 180 degrees. Programmable inverter 102, at time G, inverts the variable signal F to establish half slip indication parameters.

The capability of this comparator to detect half slips eliminates several prior art problems such as those connected with "jitter" and late slip detection following system initialization. The 180 degree parameters attributed to half slip detection provide a "jitter" rejection mechanism. The leading edge of the variable signal F may abruptly oscillate during drift, but slip detection is precluded until the coincidence detector detects the coincidence of the leading edge of both signals after the leading edge of the variable signal F drifts 180 degrees with respect to its position at the time of a first coincidence. Thereafter, the variable signal is inverted and the reference leading edge must again drift another 180 degrees to reflect a full slip. Therefore, this comparator reflects only actual frequency changes between the two signals and does not provide false full slip indications. This prevents an indication of inflated slip rates.

Also, the 180 degree parameters provide for earlier initial slip detection since a phase shift of only 180 degrees must occur before a first full slip is detected. Therefore, adjustment to the two frequencies may be made sooner after transmission begins.

Half slip detection indicates that the variable signal F has changed frequency with respect to the reference signal $F_R$. However, the comparator circuit of FIG. 1 does not generate an output until a full slip is detected. A full slip indication output is generated by slip counter 105.

Slip counter 105 responds to a signal indicative of the coincidence of the window signal and trigger pulse as shown at time C of FIG. 2. In response to this signal, coincidence detector 104 switches from a set to reset state and drives its Q output high, as previously described, and its $\overline{Q}$ output low. Coincidence detector 104 applies a low signal over path 112 from its $\overline{Q}$ output to set-reset flip-flop 121 and NAND gate 123 of slip counter 105. This low signal drives the Q output of flip-flop 121 high and thereafter, permanently sets flip-flop 121 until the entire comparator circuit is reinitialized. Therefore, flip-flop 121 maintains a high signal output from its Q output over path 122 to the lower input of NAND gate 123 throughout slip detection. As a result of the low signal on path 112 and high signal on path 122, NAND gate 123 is enabled and active signals are applied to counter 125. In particular, NAND gate 123 applies a high signal over path 124 to counter 125. Counter 125 advances in response to this high signal. However, since it is assumed that time C is the first coincidence or the start of a full slip, the output of counter 125 over path 113 in response to this advancement is disregarded.

The next coincidence of the trigger pulse and window signal is illustrated at time G of FIG. 2. In response to this coincidence, coincidence detector 104 changes to a reset state and applies a high signal from its $\overline{Q}$ output over path 112 to the upper input of NAND gate 123. As previously described, the set-reset flip-flop 121 maintains its set state from the first coincidence at time C and applies a high signal over path 122 to the lower input of NAND gate 123. The combination of these two high signals on paths 112 and 122, respectively, disables NAND gate 123 and prevents the application of active signals to counter 125. In particular, NAND gate 123 applies a low signal over path 124 to counter 125. Counter 125 does not increment in response to this low signal since this low signal does not activate the counter. Slip counter 105 in this illustrative embodiment does not produce a half slip indication output.

However, in response to the coincidence at time G, programmable inverter 102 of FIG. 1 immediately inverts the variable signal F 180 degrees with respect to its phase at the time of the coincidence. This provides a new reference leading edge which is monitored over a second 180 degrees or over the second half slip. (The inverted signal and its corresponding reference leading edge are not shown on FIG. 2). Since it has been assumed that the variable signal F is changing frequency with respect to the reference signal $F_R$ so that the two signals are of close but not equal frequencies, the reference leading edge of the signal $F_2$ drifts with respect to its shifted position until the next or third coincidence of the window signal and the trigger pulse (not shown on FIG. 2). This represents a full slip or a 360 degree phase shift. A full slip indicates that the reference signal $F_R$ and the variable signal F were of equal frequencies and in phase initially. Then, that at some point during transmission, the variable signal F changed frequency and phase with respect to the reference signal $F_R$ and thereafter returned to a state wherein the two signals were of equal frequencies and in phase again.

In response to the third coincidence of the window signal and the trigger pulse or full slip, coincidence detector 104 changes to a set state again and applies a low signal from its Q output over path 112 to the upper input of NAND gate 123 and to the input of set-reset flip-flop 121. Flip-flop 121 remains set, as previously described, and therefore applies a high signal over path 122 to the lower input of NAND gate 123. Again, this combination of a low and a high signal on paths 112 and 122, respectively, enables NAND gate 123 which now applies an active signal to counter 125. In particular, NAND gate 123 applies a high signal over path 124 to counter 125. Counter 125 advances in response to this signal and generates an output signal over path 113. This output indicates that a full slip between the reference signal $F_R$ and the variable signal F occurred. Slip counter 105 increments in response to each full slip and produces a slip rate indication. A slip rate represents the number of slips per unit time occurring between the two signals during transmission. In particular, a slip rate identifies the number of times a frequency difference occurred between the two signals during transmission.

The above-described frequency and phase comparator discloses an embodiment capable of producing a slip rate indication between two signals. The subsequent discussion discloses a second embodiment of the subject comparator circuit. This embodiment presents a more complicated circuit that provides both a slip-rate indication and a difference frequency indication.

Difference Frequency and Slip Rate Indication

Figure 3:
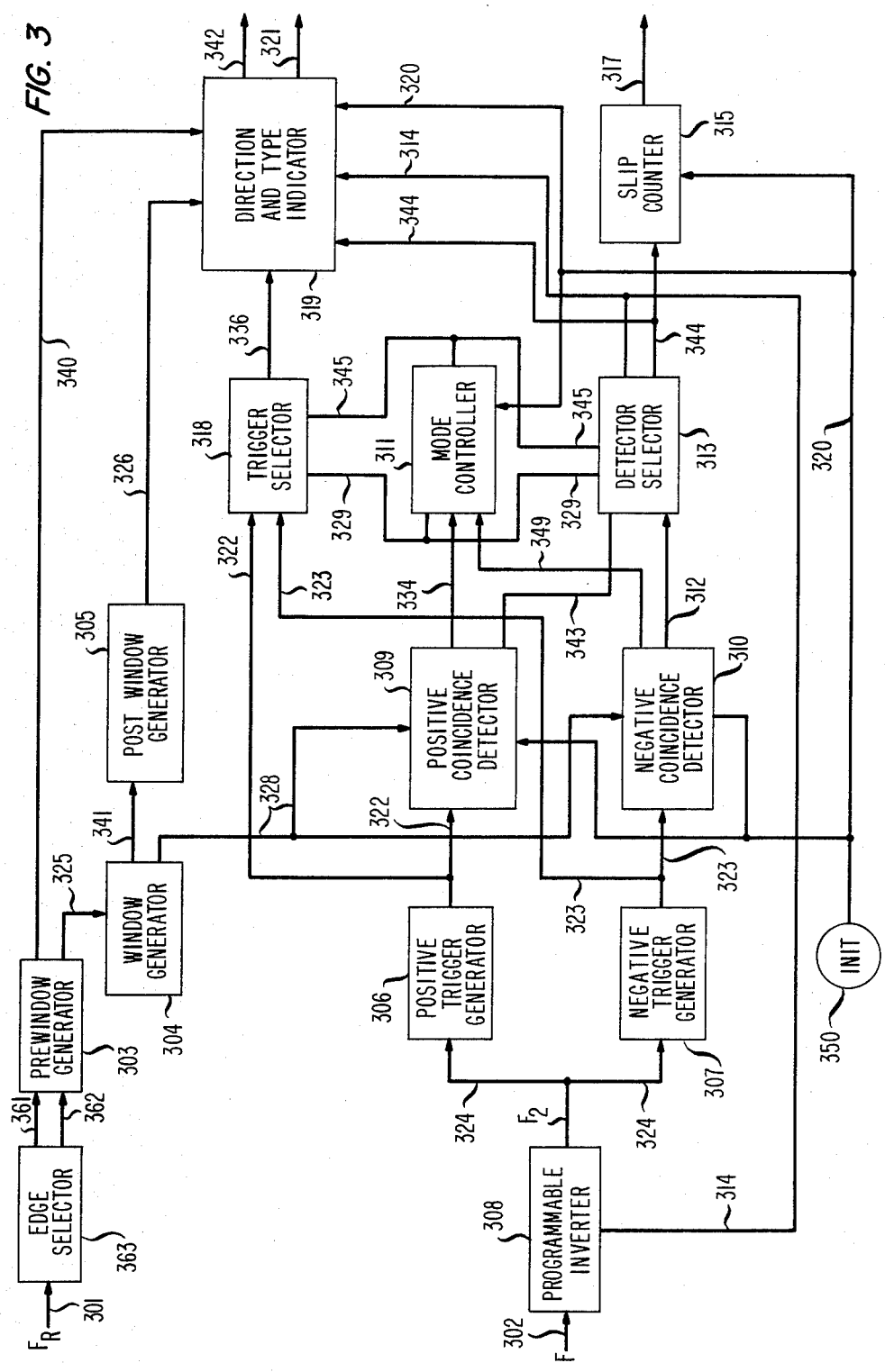
FIG. 3 discloses a second embodiment of a frequency and phase comparator providing both a slip rate and difference frequency indication.

FIG. 3 discloses a second embodiment of the subject frequency and phase comparator circuit. This comparator circuit provides a difference frequency indication in addition to a slip-rate indication. The difference frequency is determined following a 360 degree phase shift or full slip of the variable signal F with respect to the reference signal $F_R$. This difference frequency indication provides the information necessary to determine whether the frequency of the variable signal F is higher or lower than that of the reference signal $F_R$ over the duration of a full slip.

The operation of the comparator circuit of FIG. 3 with respect to the difference frequency indication is discussed in detail subsequently. The process of detecting a full slip is discussed first and in less detail since slip detection was discussed previously in connection with FIGS. 1 and 2.

Full Slip Detection

The comparator circuit of FIG. 3 detects slips between two signals in an analogous manner to the comparator circuit of FIG. 1. A coincidence detector detects the coincidences between window signals and trigger pulses, and a slip counter increments after recording the number of coincidences associated with a full slip. A full slip indicates that at some point in time during transmission the two signals were out of phase and of unequal frequency.

Figure 4:
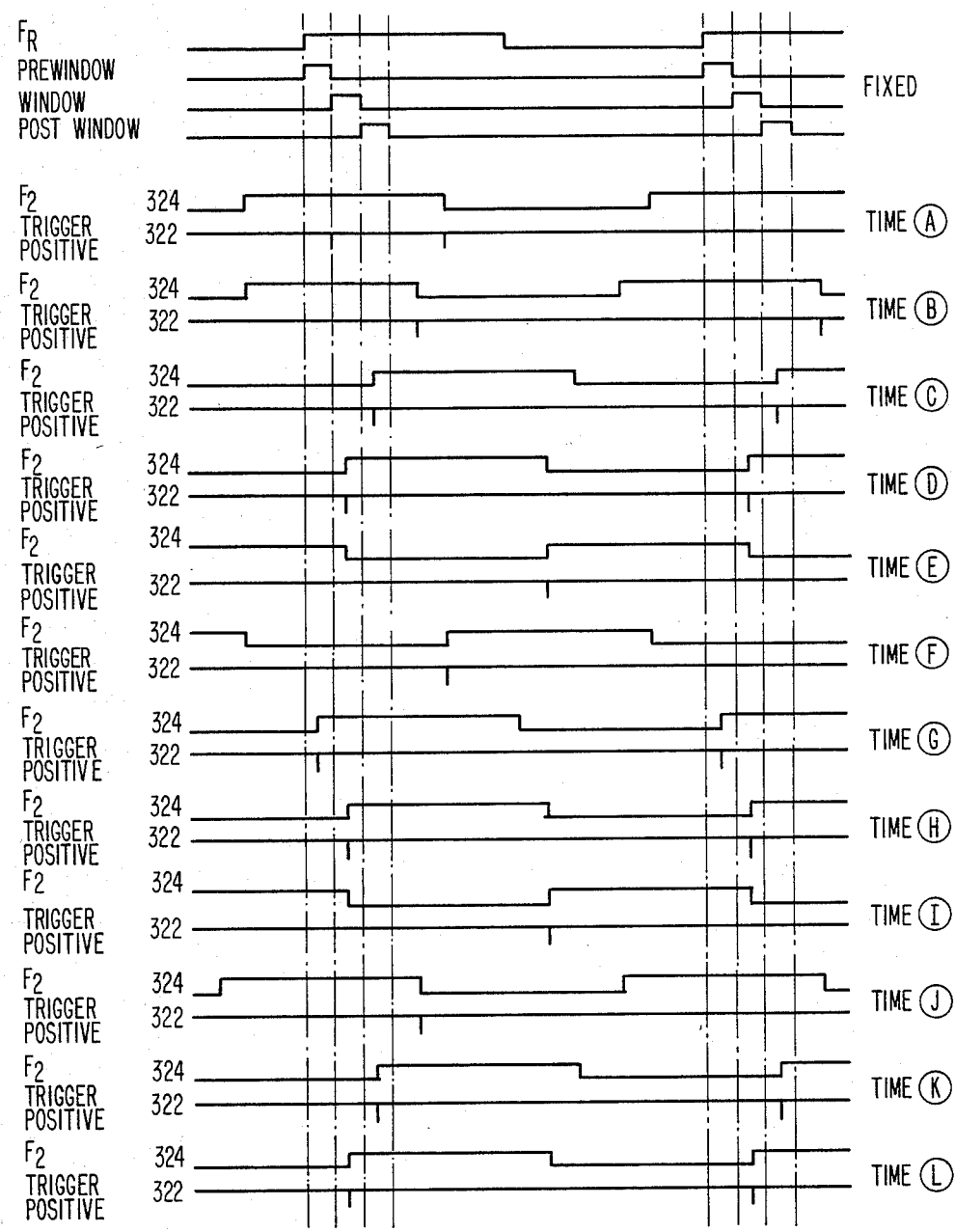
FIG. 4 illustrates a series of waveforms shown at separately identifiable times as related to the circuit of FIGS. 3, 5, 6 and 7.

The circuit of FIG. 3, for slip detection purposes, comprises window generator 304, programmable inverter 308, positive and negative edge trigger generators 306 and 307, and positive and negative edge coincidence detectors 309 and 310 and slip counter 315. FIG. 4 is discussed with reference to FIG. 3. FIG. 4 illustrates the appearance of the appropriate signals as these signals appear during a phase shift of 360 degrees or a full slip.

Assume that the reference signal $F_R$ and the variable signal F are squarewaves with transition points at the leading and trailing edges. A frequency and phase comparator circuit may monitor either the leading or trailing edges. However, prior to the process of slip detection, the comparator circuit must be conditioned to respond to only one edge consistently in order to record an accurate occurrence of a slip. Conditioning is accomplished by edge selector 363. Edge selector 363 is preprogrammed to apply active signals over either the leading edge path 361 or the trailing edge path 362 in response to the receipt of an appropriate preselected edge of the reference signal $F_R$. Active signals to the comparator circuit result only when the preselected edge occurs, and these active signals are maintained throughout the entire process of slip detection. The comparator circuit of FIG. 3 is conditioned to respond to leading edges. In particular, reference signal $F_R$ is received over path 301 and is applied to preprogrammed edge selector 363 which now responds only to leading edges. (Edge selector 363 is unresponsive to trailing edges unless the edge selector 363 is reprogrammed. Assume, for the remainder of this description, that edge selector 363 remains programmed to respond only to leading edges.) In response to each leading edge, edge selector 363 applies an active signal over leading edge path 361 to prewindow generator 303 which extends this active signal over path 325 to window generator 304. (The pre and post window generators are discussed subsequently.) Window generator 304 operates in the same manner as window generator 101 of FIG. 1. Window generator 304 responds to each leading edge of the reference signal $F_R$ and generates a window signal of a specified duration for each such response. The waveforms for the above-identified signals are illustrated on lines 301 and 328 of FIG. 4.

Variable signal F is received over path 302 by programmable inverter 308. Programmable inverter 308 operates in a similar manner to the programmable inverter 102 of FIG. 1 in that it controllably inverts the variable signal F in response to alternate coincidence signals. The coincidence signal is extended to programmable inverter 308 via circuit elements discussed subsequently. Programmable inverter 308 generates the signal $F_2$ which is shown on lines 324 of FIG. 4.

Programmable inverter 308 applies the signal $F_2$ over path 324 to positive edge trigger generator 306 and negative edge trigger generator 307. Positive edge trigger generator 306 responds in the same manner as trigger generator 103 of FIG. 1 to generate trigger positive pulses in response to each leading edge of the signal $F_2$. The square waveforms illustrated in FIG. 3 show trigger positive pulses on lines 322.

Negative edge trigger generator 307 responds only to each trailing edge of the squarewave associated with the signal $F_2$ and generates trigger negative pulses for each such response. These pulses are not shown on FIG. 3, but if shown would appear at each trailing edge of the signal $F_2$. Trigger positive and trigger negative pulses are 180 degrees out of phase with respect to each other. The negative edge and positive edge distinctions are discussed subsequently.

Coincidence detectors 309 and 310 operate in an analogous manner to coincidence detector 104 of FIG. 1. Coincidence detector 309 detects a coincidence of the trigger positive pulse on path 322 and the window signal on path 328 from window generator 303. Similarly, coincidence detector 310 detects a coincidence of the trigger negative pulse on path 323 and the window signal on path 328 from window generator 303. A coincidence detected by either detector 309 or 310 indicates that the leading and trailing edges of the two signals coincide. Additionally, this coincidence means that reference signals $F_R$ and $F_2$ are in phase and of exact frequencies. However, only leading edge signals are active as controlled by edge selector 363 and therefore, only trigger positive and leading edge window signals may be detected.

Time D on FIG. 4 represents the start of a full slip. Time D shows a coincidence of the trigger positive pulse and the window signal. In response to this coincidence, programmable inverter 308 inverts the signal $F_2$ 180 degrees with respect to its relative phase at the time D. Time E of FIG. 4 illustrates the leading edge of the signal $F_2$ shifted 180 degrees from time D. This shifted leading edge provides a reference leading edge. The establishment of the reference leading edge was described in connection with FIGS. 1 and 2, however the following discussion provides further details.

A reference edge is initially established immediately following the first coincidence in order to maintain consistency throughout the entire process of slip detection. The reference edge may be either the leading or the trailing edge, but only one edge serves consistently as the reference edge for detecting full slips. In particular, consistency reduces the uncertainty in phase shift when detecting, for example, a second full slip following detection of a first full slip. The start of the second full slip is detected within a phase shift of 180 degrees when the same reference edge is maintained. If, however, the reference edge changes to the opposite edge, for example from leading to trailing, following the first slip, the fact that the reference edge changed precludes half slip detection since there are undefined drift parameters associated with opposite reference edge. Therefore, either the positive or the negative edge detection circuitry must have priority to permanently establish which edge serves as the reference edge following the first coincidence.

FIG. 3 additionally discloses mode controller 311 and detector selector 313 to determine circuit priority. If a leading edge window signal coincides with a trigger positive pulse, positive edge coincidence detector 309 applies a signal over path 334 to mode controller 311 and a signal over path 343 to detector selector 313. Alternately, if a trailing edge window signal coincides with a trigger negative pulse, negative edge coincidence detector 310 applies a signal over path 344 to mode controller 311 and a signal over path 312 to detector selector 313. Mode controller 311 only responds to the signal associated with the preselected programmed edge. Therefore, only one type of edge coincidence signals are active signals. Mode controller 311 applies these active signals over path 345 to detector selector 313. These active signals enable detector selector 313 and allow detector selector 313 to extend only only the one type of coincidence signals; trailing edge coincidence signals (negative edge detection circuitry, generator 307 and detector 310), or leading edge coincidence signals (positive edge detection circuitry, generator 306 and detector 309), to slip counter 315. Only one type of coincidence signals may activate further circuit elements until the next initialization. Again, for the remainder of this description as shown in the example of FIG. 4, the leading edges are the monitorable edges.

As previously mentioned, the reference leading edge is established as shown at time E of FIG. 4. Assume that the signal $F_2$ changes in frequency and causes the reference leading edge to drift to the right. The next coincidence of the trigger positive pulse and the window signal occurs at time H as shown on FIG. 4. This coincidence represents the occurrence of a half slip or phase shift of 180 degrees between the reference signal $F_R$ and the signal $F_2$. At this time, slip counter 315 does not increment. This counter operates in an analogous manner to slip counter 105 of FIG. 1 and therefore only increments in response to full slips. The illustrated coincidence at time H concludes the first half of the full slip and designates the start of the second half of the full slip. Additionally, a new reference leading edge is established by programmable inverter 308 as shown at time I of FIG. 4 as signal $F_2$ is now reverted.

Assume that the variable signal F still changes frequency with respect to the reference signal $F_R$. Therefore the new reference leading edge drifts to the left until the next coincidence of the trigger positive pulse and the window signal. This third coincidence shown at time L concludes the end of a full slip. Slip counter 315 increments in response to the coincidence at time L and applies a resultant signal over path 317 indicating the occurrence of a full slip. A full slip indicates that the variable signal F changed frequency with respect to the reference signal $F_R$.

Although the logic elements of the slip detector portion of the circuit are disclosed in FIGS. 5, 6, and 7, extensive discussion of the slip detection elements are not repeated since the process of slip detection has been described in connection with FIGS. 1 and 2 and the operation of these logic elements are known to the art. Further discussion deals with the elements that provide a difference frequency indication.

Difference Frequency

Figure 5:
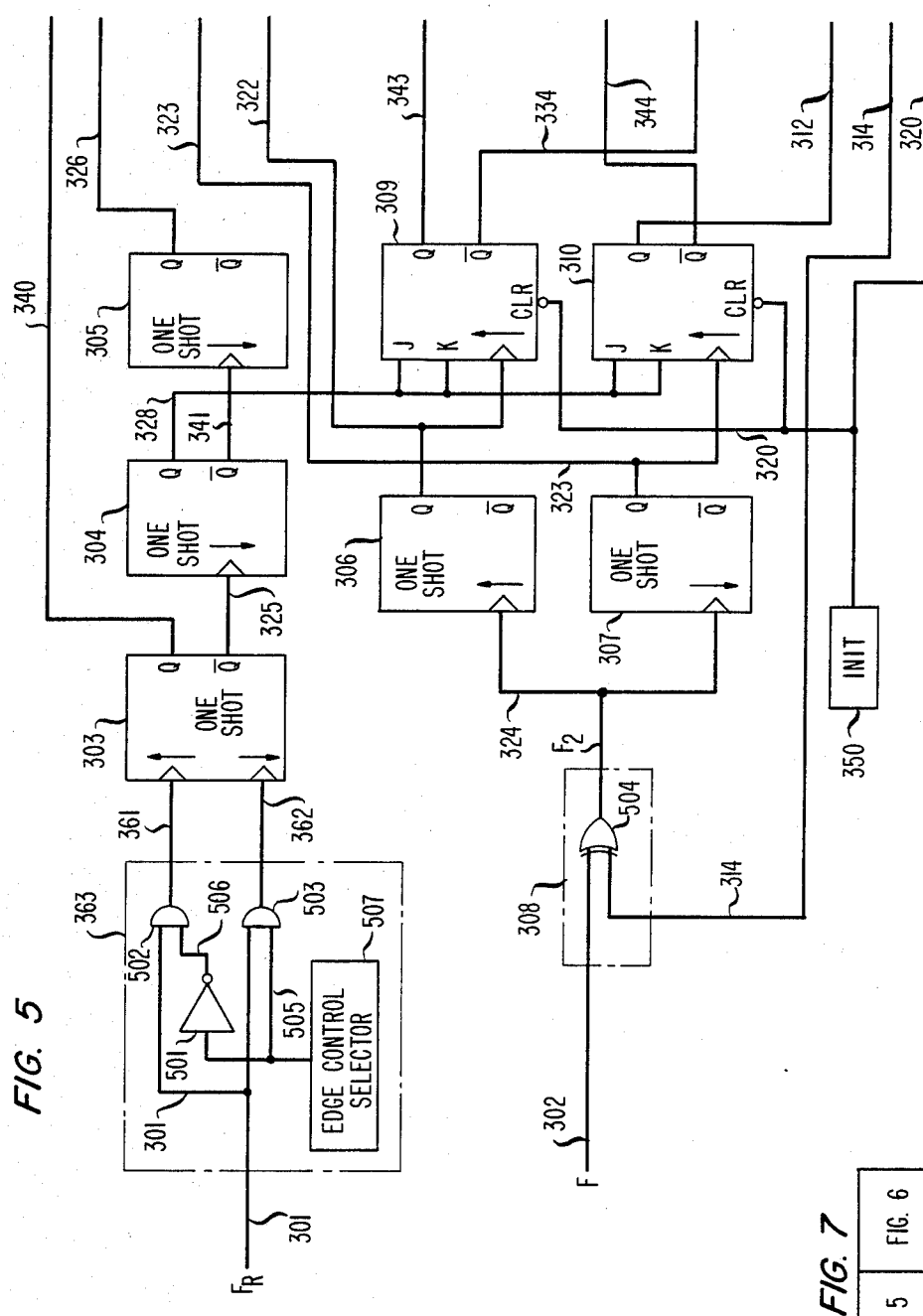
FIGS. 5 and 6, when arranged as shown in FIG. 7, disclose further details of the circuit of FIG. 4.
Figure 6:
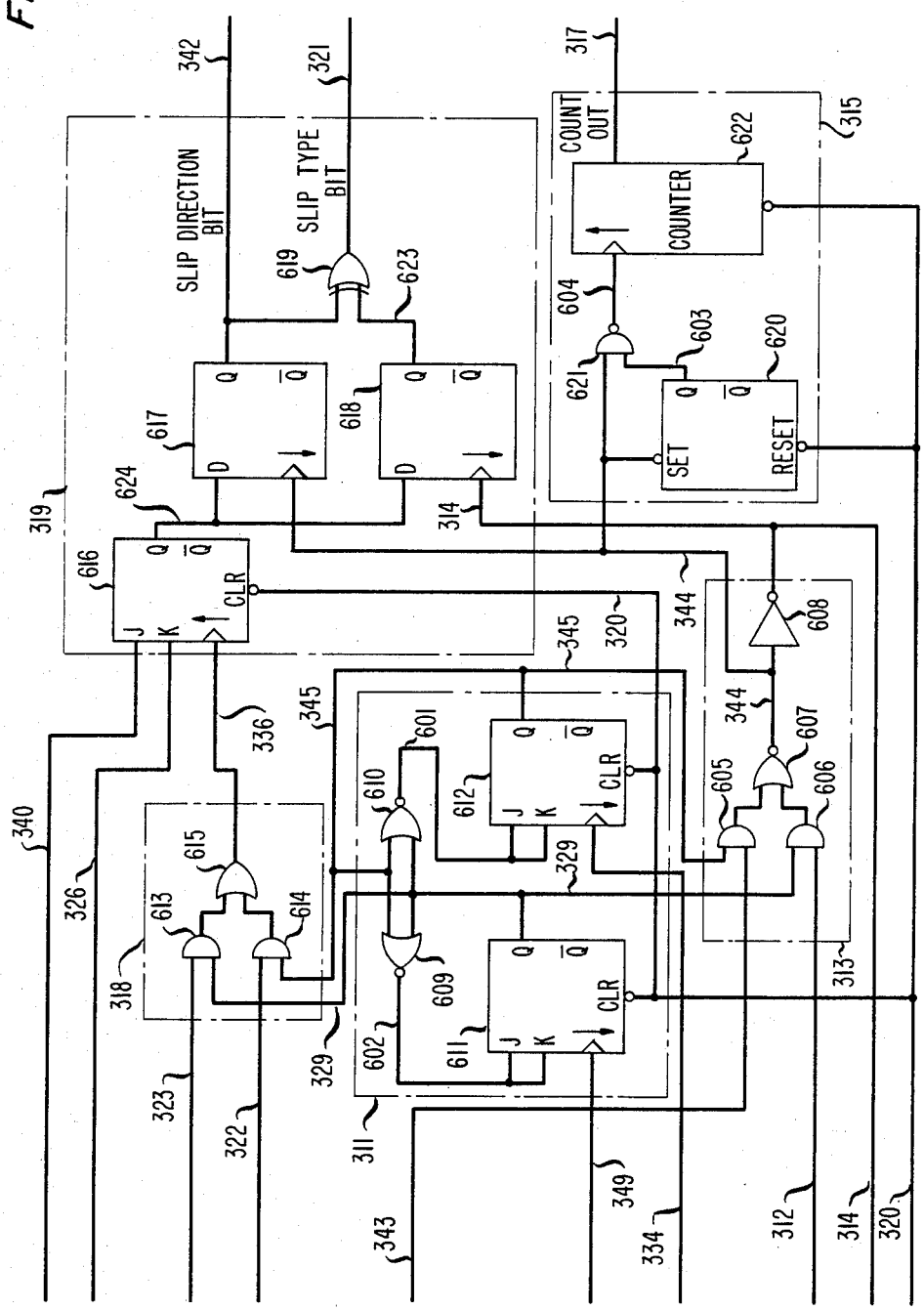

FIGS. 5 and 6, when arranged as shown in FIG. 6, disclose further details of the circuit of FIG. 3. Reference is made to FIG. 4 to describe the operation of the prewindow generator 303, post window generator 305 and direction and type indicator 319. The disclosed elements operate together to determine the direction of drift of the reference leading edge with respect to each half of a full slip. In particular, a direction indication provides information that indicates whether the frequency change of the variable signal F was higher or lower during each half of the slip than that of the reference signal $F_R$.

FIG. 5 discloses edge selector 363, window generator 304, prewindow generator 303 and post window generator 305. The operation of the edge selector 363 and window generator 304 was discussed in connection with slip detection. To detect the direction of drift over the duration of the slip, it is necessary to activate the prewindow and post window generator. As previously described, edge selector 363 generates active signals only in response to leading edges. In particular, edge control select 507 of FIG. 5 provides an output signal which selects leading edges to produce active signals. Edge control select 507 applies a low signal over path 505 to AND gate 503 and to invert element 501. In response to this low signal, AND gate 503 is partially disabled and invert element 501 inverts the low signal and applies a high signal over path 506 to AND gate 502. AND signal $F_R$ corresponds to a high, therefore with each receipt of a leading edge, a high signal is applied on path 301. The combination of a high signal on path 301 and a high signal on path 506 fully enables AND gate 502 to apply active signals over leading edge path 361 in response to each leading edge of the reference signal $F_R$. Concurrently, when each leading edge is received, AND gate 503 is fully disabled as a result of the combination of the high signal on path 301 and the low signal on path 505. This prevents any active signals from being applied on trailing edge path 362. In response to each active signal on path 361 which results from each occurrence of a leading edge in the reference signal $F_R$, prewindow generator 303, window generator 304 and post window generator 305 generate prewindow, window and post window signals sequentially. In particular, gate 502 applies a high signal over path 361 to the positive (leading edge) input of prewindow generator 303 which causes the Q output to produce a high signal on path 340 and the $\bar{Q}$ output to produce a low signal on path 325. The signal on path 340 is the prewindow signal. The signal on path 325 is the active signal for window generator 304. In response to the low signal on path 325, window generator 304 generates a high a window signal on path 328 and a low active signal on path 341. This low active signal on path 341 drives the Q output of post window generator 305 high causing the generation of a high post window signal on path 326. The sequential generation of a prewindow signal, window signal and post window signal occurs in response to each leading edge of the reference signal $F_R$ as received over path 301. The generated signals are of a specified duration at a fixed rate for each leading edge response. These signals are shown on lines 301, 340 and 326 of FIG. 4.

As previously indicated, the trigger positive pulse occurs at each leading edge of the signal $F_2$. See lines 322 and lines 324 on FIG. 4. The trigger positive pulse may occur during either a prewindow, window, or post window signal time during transmission. The comparator circuit determines the direction of drift by recording the coincidences of the positive trigger pulse with either the prewindow or post window signal. These coincidences are determinative of direction only after the occurrence of each coincidence of the window signal and the trigger positive pulse. Therefore, since time D of FIG. 4 is the first coincidence of the window signal and the trigger positive pulse, the coincidence of the post window signal and the trigger positive pulse at time C of FIG. 4 is not recorded. Recording does not begin until after the time D coincidence.

Each reception of a leading edge of the variable signal F on path 302 activates trigger generator 306 as shown by the signal F on path 324 and extended through exclusive OR gate 304 of FIG. 6 on path 324 which generates a trigger signal on path 322. In response to a high trigger pulse on path 322 and a high window signal on path 328 during the time D coincidence of FIG. 4, positive edge coincidence detector 309 changes to a set state and applies a high from its Q output over path 343 to the lower input of AND gate 605 of detector selector 313 of FIG. 6. This high signal partially enables gate 605. Alternately, each reception of a trailing edge signal on path 302 as extended through exclusive OR gate 504 of FIG. 6 on path 324 activates trigger generator 307. Negative edge trigger generator 307 responds to each low signal on path 324 and this signal drives its Q output high. A high signal is applied on path 323 and a low signal on path 328 indicating a nonresponse to a trailing edge from window generator 304 to negative edge coincidence detector 310. Coincidence detector 310 does not switch states but remains in a reset state, and a low signal is applied from its Q output to the lower input of AND gate 606 of FIG. 6. This low signal partially disables gate 606. As previously indicated, only leading edge coincidence signals are active. The $\bar{Q}$ output of detector 309 applies a low signal over path 334 to the input of flip-flop 612 of mode controller 311 of FIG. 6. This signal switches the flip-flop 612 from a low reset state to a high set state. The switching of flip-flop 612 to a high set state drives its Q output high which extends this high signal over path 345 to the upper input of AND gate 605 and to the lower input of AND gate 614. With its upper input high, and with its lower input high from the Q output of detector 309, the AND gate 605 is now fully enabled. The $\bar{Q}$ output of coincidence detector 310 applies a high signal over path 334 to flip-flop 611 which is unresponsive and maintains its reset state. Therefore, the Q output of flip-flop 611 is a low signal. This low signal is applied on path 329 to the upper input of AND gate 606 and to the lower input of AND gate 613. With its upper input low and with its lower input low from the Q output of coincidence detector 310, the AND gate 606 is now fully disabled. Any active negative edge triggered signals are now precluded from extending through detector selector 313. Conversely, enabled AND gate 605 may now extend leading edge active signals through detector selector 313. In particular, gate 605 extends a high signal through inverting OR gate 607 and inverter 608 to apply a high signal over path 314 to the clock input of flip-flop 618. Gate 607 applies a low signal over path 344 to the clock input of flip-flop 617. Gate 607 additionally applies the low signal over path 344 to the set input of flip-flop 620 and to the upper input of AND gate 621. The low at the input of flip-flop 620 and 617 and the high at the input of flip-flop 618 result in no circuit operations that need to be described at this time. In response to this first coincidence at time D, flip-flop 612 remains in its high set state for the remainder of the coincidence detection operation. The setting of flip-flop 612 conditions the circuit of FIGS. 5, 6, and 7 so that throughout the process of slip detection, the circuit responds only to the detection of positive edge coincidences. Correspondingly, flip-flop 611 remains in its reset low state throughout the entire process of slip detection and is unresponsive to negative edge coincidences since the conditioning of this circuit does not allow these types of coincidences to occur. In particular, as previously stated, in response to the coincidence at time D of FIG. 4, the Q output of flip-flop 611 is a low signal on path 329 and the Q output of flip-flop 612 is a high signal on path 345. The high signal on path 345 is applied to NOR gates 609 and 610, respectively, and the low signal on path 329 is applied to NOR gates 609 and 610, respectively. NOR gates 609 and 610 apply a low signal over paths 602 and 601, respectively, to the J and K inputs of the toggle flip-flops 611 and 612. As previously described, flip-flop 612 changed states from reset to set in response to the first coincidence signal as received over path 344 from coincidence detector 309 and flip-flop 611 did not change states since only leading edge coincidences may be detected throughout this process of slip detection. Therefore, in response to the low input signals over paths 329 and 345 to flip-flops 611 and 612, respectively, flip-flops 611 and 612 do not change states and thus permanently maintain their set and reset states throughout this process of slip detection.

Each subsequent reception of a trigger positive pulse by trigger generator 306 switches it again to a set state to drive its Q output high. This high signal extends over path 322 to the upper input of AND gate 614 to fully enable it since its lower input is already high at this time from the Q output of flip-flop 612 on path 345. The enabling of gate 614 permits the leading edge signal to extend a high signal over path 336 to the clock input of flip-flop 616. The response of flip-flop 616 to these signals is subsequently described. Alternately, each subsequent reception of a trigger negative pulse by trigger generator 307 switches it to a set state to drive its Q output high. This high signal extends over path 323 to the upper input of AND gate 613 to fully disable it since its lower input is already low at this time from the Q output of flip-flop 611 on path 329. The disabling of gate 613 prevents trailing edge signals from extending through OR gate 615 of FIG. 6.

The above-described signals that enable gates 605 and 614 in fact enable detector selector 313 and trigger selector 318, respectively, throughout the entire process of slip detection. Detector selector 313 and trigger selector 318 extend only leading edge signals to slip counter 315 and direction and type indicator 319, as subsequently described. The output of slip counter 315 is irrelevant in response to the coincidence at time D, since this is the start of a full slip. Direction and type indicator 319 provides no relevant output in response to this first coincidence since direction indication is significant only following the start of a full slip. Direction and type indicator 319 may, prior to a full slip, receive signals indicating the direction of drift of the reference leading edge if there is a change in frequency of the variable signal F. This is subsequently described.

Assume that the variable signal F is changing frequency with respect to the reference signal $F_R$ and that the variable signal F is now lower in frequency than reference signal $F_R$ as reflected by the state of the signal $F_2$. FIG. 4 illustrates waveforms of $F_2$ on lines 324 as they appear during several separately identifiable time periods after the first coincidence at time D. At time F, the reference leading edge drifts to the right due to a change in frequency that is lower in frequency than that of the reference signal $F_R$. However, until such time as there is a coincidence, the direction and type indicator 319 remains unresponsive to the direction of drift.

At time G of FIG. 4, the leading edge of the received signal on path 302 causes a trigger positive pulse from trigger generator 306 to be extended through trigger selector 318 over path 336 to flip-flop 616. This signal coincides at time G with the generated prewindow signal as received by flip-flop 616 over path 340 from prewindow generator 303. In response to this coincidence, flip-flop 616 changes to a high set state from a low reset state but no further circuit action results. Flip-flop 616 remains set to a high state unless a post window coincidence occurs at which time flip-flop 616 would be reset to a low state. This occurrence is described subsequently. However, flip-flop 616 now stores an indication that the reference leading edge of the signal on path 302 is drifting to the right and that it coincided with the window signal after moving through the prewindow side. Drift to the right indicates that the variable signal F is lower in frequency than the reference signal $F_R$ during the first half of the full slip.

At time H, the trigger positive pulse again coincides with the window signal after passing through the prewindow side from time G. Time H represents the end of a first half slip. In response to the second coincidence at time H, coincidence detector 309 receives a signal over path 322 from trigger generator 306 and a signal over path 328 from window generator 304 and, in response thereto, switches to a reset state and applies a low from its Q output over path 343 to the lower input of AND gate 605 of detector selector 313 of FIG. 6. This low signal partially disables gate 605. The $\overline{Q}$ output of detector 309 applies a high signal over path 334 to the input of flip-flop 612 of mode controller 311 of FIG. 6. Flip-flop 612 does not change state in response to this low signal, but remains in a set state as priorly described and provides a high signal from its Q output on path 345 to fully disable AND gate 605. This precludes any further active signals to slip counter 315 of FIG. 6. Flip-flop 612 also applies the high signal over path 345 to the lower input of gate 614 to partially enable this gate. This permits trigger positive pulses to be applied to the upper input of AND gate 614 to fully enable this gate and extend trigger positive pulses through trigger selector 318 to the clock input of flip-flop 616. (As previously indicated, flip-flop 611 is permanently reset and therefore gate 606 of detector selector 313 and gate 613 of trigger selector 318 are permanently disabled throughout the entire process of slip detection.) Flip-flop 616 remains in a high set state and in response to this clock input signal, applies from its Q output a high signal over path 624 to the D inputs of flip-flops 617 and 618. Gate 605 of detector selector 313 receives a low signal on path 343 from positive coincidence detector 309 and a high signal from flip-flop 612 on path 345. In response to these low and high signals, gate 605 of detector selector 313 applies a low signal to NOR gate 607 which, in turn, applies a high signal over path 314 to the clock input of flip-flop 617. Flip-flop 617 is unresponsive. Only low signals to the clock input of flip-flop 617 can activate this flip-flop. This occurrence is discussed subsequently. Flip-flop 618 receives a low signal through invert element 608 over path 314 and a high signal over path 624 from flip-flop 616. Flip-flop 618 changes to a set state to indicate a prewindow coincidence during the first half of this full slip. Flip-flop 618 will not reset again until the first half of the next full slip occurs, and then it will reset only if the coincidence is post window for the first half of the next full slip. The high signal on path 624 drives the Q output of flip-flop 618 high and therefore, a high output signal is applied through gate 619 to path 321 in response to the low signal clock input on path 314. This output signal is not significant until a full slip occurs, as subsequently described. However, the indication that the leading edge approached the window signal from the prewindow side for the first half of this full slip is stored in direction and type indicator 319 as reflected by the set state of flip-flop 618.

The logic process of an exclusive OR gate for inverting the variable signal F was previously described in connection with FIGS. 1, 2, 3, and 4 and needs no repetition. Inverter 308 inverts F in response to each alternate coincidence of the trigger positive pulse and the window signal. At time H, the variable signal F is inverted, but a new reference leading edge is generated. Assume that after the variable signal F was inverted to establish the new reference leading edge as shown at time I, the frequency of the variable signal F becomes higher than the frequency of the reference signal $F_R$. Therefore, the reference leading edge drifts to the left relative to the leading edge of the reference signal $F_R$ as shown at time J.

At time K, the reference leading edge drifts to the left so that the trigger positive pulse as applied from trigger generator 306 over path 322, through trigger selector 318 to flip-flop 616, coincides with the post window signal as applied from post window generator 305 to flip-flop 616 over path 326. In response to this coincidence, flip-flop 616 changes to a low reset state. This state reflects the fact that the reference leading edge is approaching the window signal from the post window side. Flip-flop 616 remains in this low reset state and carries no significant circuit action. Flip-flop 616 changes state only in response to a prewindow or post window coincidence, but does not provide active signal outputs until an input signal is provided to its clock input. A clock input signal is applied with each occurrence of a coincidence of a trigger positive pulse and a window signal. Therefore, the information of a post window coincidence is stored in flip-flop 616 until the third coincidence occurs, as described subsequently.

At time L, the trigger positive pulse again coincides with the window signal. Time L represents the end of the first complete 360 degree phase shift or full slip of signal $F_2$. As previously described, in response to this coincidence, coincidence detector 309 extends coincidence signals through detector selector 313 to slip counter 315 which increments slip counter 315 of FIG. 6 to provide an output indicative of the full slip. The operation of this slip counter 315, in response to a coincidence that represents a full slip was described in detail in connection with FIGS. 1, 2, 3, and 4.

Also in response to this coincidence at time L, flip-flop 616 of FIG. 7 receives a high signal over path 336 from trigger selector 318 to its clock input. Flip-flop 616 maintains its low reset state from time K and in response to the clock input signal, applies a low signal from its Q output to flip-flops 617 and 618. Flip-flop 618 maintains its high set state from time H from the first half of the slip and is unresponsive to the low signal from flip-flop 616. Alternately, flip-flop 617 changes state to a low set state. Flip-flop 617 stores an indication that the trigger positive pulse coincided with the post-window signal after the second coincidence. In particular, this signal indicates the direction of drift of the reference leading edge of the signal $F_2$ relative to the leading edge of the reference signal $F_R$ over the second half of the slip. Coincidence detector 309, as previously indicated, changes to a set state in response to this alternate coincidence at time L and applies a high signal over path 343 to detector selector 313. This signal is extended through detector selector 313 over paths 344 and 314 to the clock input of flip-flops 617 and 618, respectively. In response to the low clock signal on path 344, flip-flop 617 is activated and applies a low signal over path 342 from its Q output. Concurrently, flip-flop 618 is unresponsive to the high clock signal, since it remains reset from the coincidence described with reference to time H. Flip-flop 618, therefore, applies a high signal over path 623 from its Q output at this time. Gate 619 in response to the combination of a low signal on path 342 and a high signal on path 623 provides a high signal output over path 321. This high signal output indicates that the type of coincidences that resulted over the duration of the full slip were prewindow and then post window as opposed to both post window, both prewindow or post window, then prewindow coincidences.

In summary, flip-flop 618 stores the direction indication for the first half of the full slip and flip-flop 617 stores the direction indication for the second half of the slip. Flip-flop 617 applies an output signal, a 0, over path 342 to indicate the direction of drift of the reference leading edge over the second half of the full slip. Flip-flop 618 applies a signal, a 1, over path 623 to gate 619 to indicate the direction of drift of the reference leading edge over the first half of the full slip. Gate 619 is enabled as a result of the signals on path 342 and 623, and applies an output signal over path 321. The signal, a 1, on path 321 indicates whether the reference leading edge consistently drifted in one direction or opposite directions over the duration of the full slip. The above direction indications are determinative of the magnitude of the frequency difference between the reference signal $F_R$ and signal F after the occurrence of the full slip.

In particular, direction and type indicator 319 generates a slip type bit on path 321 and a slip-direction bit on path 342. These bits provide information as to the direction of drift of the reference leading edge of the variable signal F with respect to the leading edge of the reference signal $F_R$ over the duration of a slip.

To illustrate, consider the current example where the slip type bit is a 1. A 1 bit results from the combination of two bits, a 0 bit on path 342 indicating the direction, post window, of drift of the reference leading edge over the last half slip and a 1 bit on path 623 indicating the opposite direction, prewindow, of drift of the reference leading edge over the first half slip. These bits indicate that the two half slips occurred in opposite directions, first right and then left, with respect to one another. See FIG. 4, times D through H and times H through L. The slip direction bit on path 342 is a 0. This indicates the direction, post window (left), of drift of the reference leading edge over the last half of the full slip. (See FIG. 4, times H through L.)

The slip direction bit and slip type bit are interpreted together to provide a difference frequency indication with respect to a full slip. Therefore, during the first half slip, (times D through H of FIG. 4) the variable signal F was lower in frequency than the reference signal $F_R$, and during the second half slip, (times H through L of FIG. 4) the variable frequency F was higher in frequency than the reference signal $F_R$.

Numerous variations of type and direction bits are possible. First, where the variable signal F is consistently higher in frequency than reference signal $F_R$ over the duration of the slip, the following bits result. The slip direction bit is a 0 and a slip type bit is a 0. This bit pattern indicates that drift of the reference edge for both halves of the slip are in the same direction, post-window (left). Second, where the variable signal F is consistently lower in frequency than reference signal $F_R$, the slip direction bit is a 1 and the slip type bit is a 0. This indicates that drift of the reference edge for both halves of the slip are in the same direction, pre-window (right). Third, where during the first half slip the frequency of the variable signal F is higher than the frequency of the reference signal $F_R$ and during the second half slip the frequency of the variable signal F is lower than the frequency of the reference signal $F_R$, the slip direction bit and the slip type bit are both 1's. This indicates that the reference edge drifted in opposite directions for each half slip, post window (left) first and prewindow (right) last.

The preceding discussion was based on the fact that positive edge signals were the active signals. However, if the negative edge signals were the active signals, edge selector 363 would be programmed to respond to trailing edges and mode controller 311 would activate the flip-flop 611 in response to trailing edge coincidence signals from the negative edge coincidence detector 310. Mode controller 311 would then enable detector selector 313 and trigger generator 307 to extend negative edge signals to direction and type indicator 319 and slip counter 307. Signals from the positive edge trigger generator 306 and positive edge coincidence detector 309 would be precluded.

The subject frequency and phase comparator circuit provides more precise adjustment and control information since frequency difference indications are obtained with respect to each half slip.

What is claimed is:

1. A frequency and phase comparator for detecting phase shifts indicative of frequency differences between a first signal $F_R$ and a second signal F having identifiable preselected transitions, comprising:
   means for applying said first and second signals to first and second inputs, respectively, of said comparator,
   means responsive to the reception of each preselected transition in said first signal $F_R$ for generating a window pulse,
   means responsive to the reception of each preselected transition in said second signal F for generating a trigger pulse,
   a detector for generating a coincidence signal in response to each coincidence between said window pulse and said trigger pulse,
   means interposed between said second input and said trigger pulse generating means and responsive to the generation of alternate ones of said coincidence signals by said detector for inverting said second signal until the generation of the next coincidence signal, and
   means responsive to the generation of alternate ones of said coincidence signals for generating a slip signal indicative of either two contiguous 180 degree phase shifts or a single 360 degree phase shift between said first and said second signals.

2. The comparator of claim 1 wherein said slip signal generating means includes:
   means for generating a constant state signal in response to the detection of an initial one of said coincidences,
   a counter, and
   means responsive to said constant state signal and the generation of alternate ones of said coincidence signals for gating alternate ones of said coincidence signals to said counter,
   said counter being responsive to each receipt of a coincidence signal for incrementing by a count of 1.

3. The comparator of claim 1 wherein said preselected transitions are the leading edges of both the $F_R$ and the F signals.

4. The comparator of claim 1 wherein said preselected transitions may be either the leading or the trailing edges of both the $F_R$ and F signals.

5. A method of operating a comparator for detecting phase shifts indicative of frequency differences between a first signal $F_R$ and a second signal F having identifiable preselected transitions, said method including the steps of:
   (1) applying said first and second signals to first and second inputs, respectively, of said comparator,
   (2) generating a window pulse in response to each preselected transition of said first signal,
   (3) generating a trigger pulse in response to each preselected transition of said second signal,
   (4) generating a coincidence signal in response to each coincidence between said window pulse and said trigger pulse,
   (5) inverting said second signal in response to the generation of alternate ones of said coincidence signals for a time duration terminating with the generation of the next coincidence signal, and
   (6) applying said coincidence signals to a gating means to provide a slip signal indicative of two contiguous 180 degree phase shifts or a single 360 degree phase shift between said first and said second signals.

6. The method of claim 5 wherein the step of providing a slip signal includes the steps of:
   (1) generating a constant state signal following the generating of an initial one of said coincidence signals,
   (2) applying alternate ones of said coincidence signals to a counter, and
   (3) incrementing said counter in response to each receipt of a coincidence signal by said counter.

7. The comparator of claim 5 wherein said preselected transitions are the leading edges of both the $F_R$ and the F signals.

8. The comparator of claim 5 wherein said preselected transitions may be either the leading or the trailing edges of both the $F_R$ and F signals.

9. A frequency and phase comparator for detecting phase shifts indicative of frequency differences between a first signal $F_R$ and a second signal F having consistently identifiable preselected transitions, comprising:
   means for applying said first and second signals to first and second inputs, respectively, of said comparator,
   means responsive to the reception of each preselected transition in said first signal $F_R$ for generating a window pulse of a fixed duration,
   means responsive to the reception of each preselected transition in said second signal F for generating a trigger pulse of a lesser duration than said said window pulse,
   detector means for generating a coincidence signal in response to each coincidence between said window pulse and said trigger pulse, each coincidence signal indicating a concurrence between said preselected transitions of said first and second signals following a 180 degree phase shift between said first and said second signals,
   means interposed between said second input and said trigger pulse generating means and responsive to the generation of alternate ones of said coincidence signals for inverting said second signal until the generation of the next coincidence signal to establish a monitorable reference of said preselected transition of said second signal for each contiguous 180 degree phase shift between said first and said second signals, and
   means responsive to the generation of alternate ones of said coincidence signals for generating a slip signal indicative of either two contiguous 180 degree phase shifts or a single 360 degree phase shift between said first and said second signals, said slip signal indicating a frequency difference between said first and said second signals.

10. The comparator of claim 9 wherein said slip signal providing means includes:
   means for generating a constant state signal in response to the detection of an initial one of said coincidences,
   a counter, and
   means responsive to said constant state signal and to said generation of alternate ones of said coincidence signals for gating alternate ones of said coincidence signals to said counter,
   said counter being responsive to each receipt of a coincidence signal for incrementing by a count of 1.

11. The comparator of claim 9 wherein said preselected transitions are the leading edges of both the $F_R$ and the F signals.

12. The comparator of claim 9 wherein said preselected transitions may be either the leading or the trailing edges of both the $F_R$ and F signals.

13. A method of operating a comparator for detecting phase shifts indicative of frequency differences between a first signal $F_R$ and a second signal F having consistently identifiable preselected transitions, said method including the steps of:
   (1) applying said first and second signals to first and second inputs, respectively, of said comparator,
   (2) generating a window pulse in response to each preselected transition of said first signal,
   (3) generating a trigger pulse in response to each preselected transition of said second signal,
   (4) generating a coincidence signal in response to each coincidence between said window pulse and said trigger pulse for indicating a concurrence between said preselected transitions of said first and second signals following each 180 degree phase shift between said first and said second signals,
   (5) inverting said second signal in response to the generation of each alternate one of said coincidence signals for a time duration terminating with the generation of the next coincidence signal to establish a monitorable reference of said preselected transitions in said second signal for each contiguous 180 degree phase shift between said first and said second signals, and
   (6) applying said coincidence signals to a gating means to provide a slip signal indicative of two contiguous 180 degree phase shifts or a single 360 degree phase shift between said first and said second signals, said slip signal indicating a frequency difference between said first and said second signals.

14. The method of claim 13 wherein the step of providing a slip signal includes the steps of:
   (1) generating a constant state signal following the generation of an initial one of said coincidence signals,
   (2) applying alternate ones of said coincidence signals to a counter, and
   (3) incrementing said counter in response to the generation of alternate ones of said coincidence signals.

15. The comparator of claim 13 wherein said preselected transitions are the leading edges of both the $F_R$ and the F signals.

16. The comparator of claim 13 wherein said preselected transitions may be either the leading or the trailing edges of both the $F_R$ and F signals.

17. A frequency and phase comparator for detecting phase shifts indicative of frequency differences between a first signal $F_R$ and a second signal F having waveforms with identifiable positive or negative transitions comprising:
   means responsive to either positive or negative transitions of said first signal $F_R$ for generating controllably either a positive or a negative window pulse, respectively, with each occurrence of said positive or negative transitions, respectively, in said first signal,
   means responsive to each positive transition of said second signal F for generating a positive trigger pulse,
   means responsive to each negative transition of said second signal F for generating a negative trigger pulse,
   means responsive to said controllably generated window pulse and a positive trigger pulse for generating a positive coincidence signal for indicating concurrence between positive transitions of said first and said second signals if said controllably generated window pulse is positive,
   means responsive to said controllably generated window pulse and a negative trigger pulse for generating a negative coincidence signal for indicating concurrence between negative transitions of said first and said second signals if said controllably generated window pulse is negative, and means responsive to the generation of said positive coincidence signal and to said negative coincidence signal for generating a control signal indicating whether said positive coincidence signal or said negative coincidence signal occurred first to condition a selector to respond only to subsequently received coincidence signal of the type indicated by said control signal.

18. The comparator of claim 17 wherein said comparator further includes:
means responsive to alternate ones of said subsequently generated coincidence signal associated with said control signal for inverting said second signal until the generation of the next coincidence signal to establish a monitorable reference transition in said second signal following a 180 degree phase shift between said first and second signals, and
means responsive to the generation of alternate ones of said coincidence signals of the type indicated by said control signal for generating a slip signal indicative of either two contiguous 180 degree phase shifts or a single 360 degree phase shift between said first and said second signals, said slip signal indicating a frequency difference between said first and said second signals.

19. A method for operating a frequency and phase comparator that receives a first signal $F_R$ and a second signal F having identifiable positive or negative transitions, said method including the steps of:
(1) controllably generating either a positive or a negative window pulse in response to each occurrence of said identifiable positive or negative transitions, respectively, in said first signal,
(2) generating a positive trigger pulse in response to each occurrence of a positive transition in said second signal,
(3) generating a negative trigger pulse in response to each occurrence of a negative transition in said second signal,
(4) generating a positive coincidence signal in response to a coincidence between said controllably generated window pulse and a positive trigger pulse for indicating a concurrence between said positive transitions of said first and second signals if said controllably generated window pulse is positive,
(5) generating a negative coincidence signal in response to a coincidence between said controllably generated window pulse and a negative trigger pulse for indicating a concurrence between said negative transitions of said first and second signals if said controllably generated window pulse is negative, and
(6) generating a control signal indicating whether said positive coincidence signal or said negative coincidence signal occurred first to condition a selector to respond only to subsequently received coincidence signals of the type indicated by said control signal.

20. The method of claim 19 wherein conditioning said comparator includes the further steps of:
generating an inverted second signal in response to the subsequent generation of alternate ones of said coincidence signals of the type indicated by said control signal until the next generation of a coincidence signal of the type indicated by said control signal to establish a monitorable reference transition in said second signal following a 180 degree phase shift between said first and said second signals, and
applying said coincidence signals of the indicated type to a gating means to provide a slip signal indicative of two contiguous 180 degree phase shifts or a single 360 degree phase shift between said first and said second signals.

21. A frequency and phase comparator for detecting phase shift directions indicative of frequency differences between a first signal $F_R$ and a second signal F having identifiable preselected transitions, comprising:
means responsive to each preselected transition of said first signal $F_R$ for generating a prewindow, a window, and a post window pulse,
means responsive to each of said preselected transitions of said second signal F for generating a trigger pulse,
means responsive to the coincident generation of said prewindow pulse and said trigger pulse for generating a preindication signal,
means responsive to the coincident generation of said post window pulse and said trigger pulse for generating a post indication signal,
means responsive to the coincident generation of said window pulse and said trigger pulse for generating a coincidence signal indicating concurrence between said identical preselected transitions of said first and second signals following each 180 degree phase shift between said first and said second signals, and
means responsive to said generated pre or post indication signal and said coincidence signal for producing direction signals indicative of the direction of drift with respect to two contiguous 180 degree phase shifts or one 360 degree phase shift between said first and second signals wherein direction of drift represents a frequency difference over the duration of each 180 degree phase shift.

22. A method for detecting phase shift directions indicative of frequency differences between a first signal $F_R$ and a second signal F having identifiable transitions, said method including the steps of:
(1) monitoring preselected transitions of each of said signals,
(2) generating a prewindow, a window and a post window pulse with each receipt of said preselected transitions of said first signal,
(3) generating a trigger pulse with each receipt of said preselected transitions of said second signal,
(4) producing a preindication signal in response to each coincidence between said prewindow pulse and said trigger pulse,
(5) producing a post indication signal in response to each coincidence between said post window pulse and said trigger pulse,
(6) generating a coincidence signal indicating a concurrence between said preselected transitions following each 180 degree phase shift between said first and second signals in response to each coincidence between a window pulse and a trigger pulse, and
(7) providing direction signals indicative of the direction of drift with respect to two contiguous 180 degree phase shifts or a single 360 degree phase shift between said first and second signals in response to said pre or post indication signals and said coincidence signal wherein direction of drift represents the frequency difference between said signals over the duration of each 180 degree phase shift.

23. A frequency and phase comparator for detecting phase shifts and directions indicative of frequency differences between a first signal $F_R$ and a second signal F having identifiable preselected transitions comprising:
- means for applying said first and said second signals to first and second inputs, respectively, of said comparator,
- means responsive to the reception of each preselected transition in said first signal $F_R$ for generating a window pulse, a prewindow pulse and a post window pulse,
- means responsive to the reception of each preselected transition in said second signal F for generating a trigger pulse,
- detector means responsive to each coincidence of said window pulse and said trigger pulse for generating a coincidence signal indicating a concurrence between said preselected transitions of said first and second signals following each 180 degree phase shift between said first and said second signals,
- means interposed between said second input and said trigger pulse generating means and responsive to alternate ones of said generated coincidence signals for inverting said second signal until the generation of the next coincidence signal to establish a monitorable reference of said preselected transition of said second signal for each contiguous 180 degree phase shift between said first and said second signals,
- means responsive to the generation of alternate ones of said coincidence signals for generating a slip signal indicative of either two contiguous 180 degree phase shifts or a single 360 degree phase shift between said first and said second signals to indicate a frequency difference between said first and said second signals during said 360 degree phase shift,
- means responsive to the coincident generation of said prewindow pulse and said trigger pulse for generating a preindication signal,
- means responsive to the coincident generation of said post window pulse and said trigger pulse for generating a post indication signal, and
- means responsive to said generated pre and post indication and said coincidence signal for producing direction signals indicative of the direction of drift with respect to two contiguous 180 degree phase shifts or a single 360 degree phase shift between said first and second signals wherein direction of drift represents a frequency difference over the duration of each 180 degree phase shift.

24. A method of operating a comparator for detecting phase shifts and directions indicative of frequency differences between a first signal $F_R$ and a second signal F having identifiable preselected transitions, said method including the steps of:
(1) applying said first and second signals to first and second inputs, respectively, of said comparator,
(2) generating a window, a prewindow and a post window pulse in response to each preselected transition of said first signal,
(3) generating a trigger pulse in response to each preselected transition of said second signal,
(4) generating a coincidence signal in response to each coincidence between said window pulse and said trigger pulse for indicating a concurrence between said preselected transitions of said first and second signals following each 180 degree phase shift between said first and said second signals,
(5) inverting said second signal in response to the generation of alternate ones of said coincidence signals for a time duration terminating with the generation of the next coincidence signal to establish a monitorable reference of said preselected transition in said second signal for each contiguous 180 degree phase shift between said first and said second signals,
(6) providing a slip signal indicative of two contiguous 180 degree phase shifts or a single 360 degree phase shift between said first and said second signals for indicating a frequency difference between said first and said second signal during said 360 degree phase shift,
(7) producing a preindication signal in response to each coincidence between said prewindow pulse and said trigger pulse,
(8) producing a post indication signal in response to each coincidence between said post window pulse and said trigger pulse, and
(9) generating in response to said pre or post indication signal and to said coincidence signal direction signals indicative of the direction of drift with respect to two contiguous 180 degree phase shifts or a single 360 degree phase shift between said first and said second signals wherein direction of drift represents frequency difference between said first and said second second signals over the duration of each 180 degree phase shift.

* * * * *